(12) United States Patent  (10) Patent No.: US 8,781,539 B1
Jin et al.  (45) Date of Patent: Jul. 15, 2014

(54) METHOD AND APPARATUS FOR REDUCING WAKE UP TIME OF A POWERED DOWN DEVICE

(71) Applicant: Marvell International Ltd., Hamilton (BM)

(72) Inventors: Xiaodong Jin, Sunnyvale, CA (US); King Chun Tsai, San Jose, CA (US); Yonghua Song, Saratoga, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/745,727

(22) Filed: Jan. 18, 2013

Related U.S. Application Data

(63) Continuation of application No. 11/546,605, filed on Oct. 11, 2006, now Pat. No. 8,359,074, which is a continuation of application No. 10/753,101, filed on Jan. 6, 2004, now Pat. No. 7,184,799.

(60) Provisional application No. 60/470,687, filed on May 14, 2003.

(51) Int. Cl.
*H04B 1/38* (2006.01)

(52) U.S. Cl.
USPC ........................................ 455/574; 455/127.5

(58) Field of Classification Search
USPC ........ 455/127.1, 422.1, 456.2, 457, 572, 574, 455/127.5, 456.1
See application file for complete search history.

(56) References Cited

U.S. PATENT DOCUMENTS

| | | | |
|---|---|---|---|
| 4,637,073 A | 1/1987 | Selin et al. | |
| 5,084,665 A * | 1/1992 | Dixon et al. | 323/281 |
| 5,122,018 A | 6/1992 | Zion | |
| 5,123,018 A | 6/1992 | Peterson | |
| 6,169,449 B1 | 1/2001 | Hasegawa | |
| 6,212,398 B1 | 4/2001 | Roberts et al. | |
| 6,331,830 B1 | 12/2001 | Song et al. | |
| 6,337,990 B1 | 1/2002 | Koshino | |
| 6,408,008 B1 | 6/2002 | Komarek et al. | |
| 6,489,843 B1 | 12/2002 | Nishijima et al. | |
| 6,766,156 B1 | 7/2004 | Hayashihara | |
| 6,782,062 B1 | 8/2004 | Wieck | |

(Continued)

OTHER PUBLICATIONS

IEEE Computer Society, "Information Technology—Telecommunications and Information Exchange Between Systems—Local and Metropolitan Area Networks—Specific Requirements—Part 11: Wireless LAN Medium Access Control (MAC) and Physical Layer (PHY) Specifications", IEEE Std 802.11—First Edition, 1999.

(Continued)

*Primary Examiner* — Myron K Wyche

(57) ABSTRACT

A method includes, in at least one aspect, connecting an input of a bias circuit and an output of the bias circuit to another circuit while the other circuit is in a first power mode, such that the bias circuit has an operating state corresponding to the first power mode; switching the input of the bias circuit and the output of the bias circuit from the other circuit to a dummy circuit when a power mode of the other circuit is changed from the first power mode to a second power mode; and maintaining the bias circuit at the operating state corresponding to the first power mode using the dummy circuit while the other circuit is in the second power mode.

18 Claims, 5 Drawing Sheets

(56) References Cited

U.S. PATENT DOCUMENTS

| | | | |
|---|---|---|---|
| 6,812,786 | B2 | 11/2004 | Jackson et al. |
| 6,819,179 | B2 | 11/2004 | Raja et al. |
| 6,897,729 | B1 | 5/2005 | Jin et al. |
| 7,016,654 | B1 | 3/2006 | Bugeja |
| 2002/0019219 | A1 | 2/2002 | Doherty |
| 2002/0077074 | A1 | 6/2002 | Piazza |
| 2003/0211870 | A1* | 11/2003 | Jiguet et al. .................. 455/574 |
| 2004/0077383 | A1 | 4/2004 | Lappetelainen et al. |
| 2004/0102173 | A1 | 5/2004 | Darabi |
| 2004/0192408 | A1 | 9/2004 | Sharp et al. |
| 2005/0043068 | A1 | 2/2005 | Shohara et al. |

OTHER PUBLICATIONS

IEEE Computer Society, "Supplement to IEEE Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications: High-speed Physical Layer in the 5 GHZ Band", IEEE Std 802.11a—1999 (Supplement to IEEE Std 802.11—1999).

IEEE Computer Society, "Supplement to IEEE Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications: Higher-speed Physical Layer Extension in the 2.4 GHZ Band", IEEE Std 802.11b—1999 (Supplement to IEEE Std 802.11—1999).

IEEE Computer Society, "IEEE Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications: Amendment 7: Medium Access Control (MAC) Quality of Service (QoS) Enhancements", IEEE P802.11e/D11.0, Oct. 2004.

IEEE Computer Society, "IEEE Standard for Information Technology—Draft Supplement to Standard [for] Information Technology—Telecommunications and Information Exchange Between Systems—Local and Metropolitan Area Networks—Specific Requirements—Part 11: Wireless LAN Medium Access Control (MAC) and Physical Layer (PHY) Specifications: Further Higher Data Rate Extension in the 2.4 GHz Band", IEEE P802.11g/D8.2, Apr. 2003.

IEEE Computer Society, "IEEE Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications: Amendment 5: Spectrum and Transmit Power Management Extensions in the 5 GHz Band in Europe", IEEE P802.11h—2003.

IEEE Computer Society, "IEEE Standard for Information Technology—Telecommunications and Information Exchange Between Systems—Local and Metropolitan Area Networks—Specific Requirements—Part 11: Wireless LAN Medium Access Control (MAC) and Physical Layer (PHY) Specifications: Amendment 6: Medium Access Control (MAC) Security Enhancements", IEEE Std 802.11i—2004.

IEEE Computer Society, "IEEE Project 802.14/a Draft 3 Revisions 3—Cable-TV Access Method and Physical Layer Specification", IEEE 802.14 Draft3 R3—Oct. 25, 1998.

\* cited by examiner

METHOD AND APPARATUS FOR REDUCING WAKE UP TIME OF A POWERED DOWN DEVICE

CROSS-REFERENCE TO RELATED APPLICATIONS

This application is a continuation application of U.S. patent application Ser. No. 11/546,605, filed Oct. 11, 2006, now U.S. Pat. No. 8,359,074, which is a continuation application of U.S. patent application Ser. No. 10/753,101, filed Jan. 6, 2004, now U.S. Pat. No. 7,184,799, which claims the benefit of priority of U.S. Provisional Application No. 60/470,687, filed May 14, 2003.

BACKGROUND

A key building block of a wireless radio frequency (RF) transceiver is a low noise amplifier (LNA). A LNA amplifies an RF signal. A bias circuit typically supplies bias signals to the LNA.

FIG. 1 shows a conventional bias circuit 100 coupled to a LNA 102. LNA 102 includes a power source 104, resistors 106-108, an inductor 110, capacitors 112-114, and a bipolar transistor 116. Bias circuit 100 includes a reference current source 118, resistor 120, and a comparative amplifier 122. Bias circuit 100 provides a bias voltage 124 to LNA 102. Comparative amplifier 122 of bias circuit 100 generates bias voltage ($V_{bias}$) 124 by comparing a voltage at node 126 in LNA 102 to a reference voltage ($V_{ref}$) generated by bias circuit 100 at node 128.

FIG. 2 shows an example comparative amplifier 122 in greater detail. Comparative amplifier 122 includes PMOS transistors 200-202 and bipolar transistors 204-208. Comparative amplifier 122 also typically includes a capacitor 210 coupled to node 212. Capacitor 210 generally has a large capacitance to filter high frequency supply noise and prevents the high frequency supply noise from being passed into LNA 102 (FIG. 1), where the high frequency supply noise could adversely affect performance of LNA 102 (FIG. 1).

Wireless RF transceivers are typically powered down (e.g., into a sleep mode) to conserve energy during periods of inactivity. A critical factor in performance of wireless devices is the wake up time of the device. The wake up time of a device is the total amount of time required for a device to return to a normal operating (e.g., functioning) state after having been powered down.

Referring to FIGS. 1 and 2, LNA 102 that is controlled by conventional bias circuit 100 will have a long wake up time due to the large capacitance of capacitor 210. More specifically, when a wireless transceiver is powered down, current flowing through bipolar transistor 116 is shut off (e.g., by pulling the base of bipolar transistor 116, at node 130, low). Once the current flowing through bipolar transistor 116 is shut off, the voltage at node 126 also goes high, and as a result, the voltage at node 212 shifts from a normal operating voltage to VDD (or ground depending upon the design of the comparative amplifier). During wake up, due to the large capacitance at node 212, the charging of capacitor 210 will delay for a significant amount of time the return of node 212 to a normal operating voltage.

SUMMARY

In general, in one aspect, this specification describes a biasing system for biasing a main circuit configured to operate in a first mode and a power down mode. The biasing system includes a circuit configured to maintain a bias circuit in an operating state during a time a main circuit is operating in a power down mode, and a switch circuit configured to switch a bias output of the bias circuit from the main circuit to the circuit when the main circuit is powered down from the first mode to the power down mode.

Particular implementations can include one or more of the following features. The bias circuit can be configured to provide the bias output to the main circuit during a time the main circuit is operating in the first mode. The bias output can be a bias current or a bias voltage. The main circuit can consume less power when operating in the power down mode than when the main circuit is operating in the first mode. The circuit can be configured to maintain a lead to the bias circuit at a predetermined operating voltage level during a time the main circuit is operating in the power down mode. The main circuit can be a low noise amplifier (LNA).

In general, in another aspect, this specification describes a method for biasing a circuit to be powered down. The method includes switching a bias output from a bias circuit coupled to a first circuit to a second circuit, and maintaining the bias circuit at an operating state while the first circuit is powered down.

Particular implementations can include one or more of the following features. The method can further include powering down the first circuit including reducing power consumption of the first circuit, or shutting off current flowing through the first circuit. The first circuit can be an LNA. The second circuit can have a lower current draw than the first circuit. The second circuit can be operational only when the first circuit is powered down. Switching a bias output can include switching a bias current, or a bias voltage, from the first circuit to the second circuit. Maintaining the bias circuit at the operating state can include maintaining a lead to the bias circuit at a predetermined voltage level.

In general, in another aspect, this specification describes a wireless transceiver. The wireless transceiver includes an amplifier configured to receive an input RF signal. The amplifier includes a biasing system comprising a low noise amplifier (LNA) to amplify the input RF signal, a bias circuit configured to provide a bias output to the LNA during a time the LNA is operating in a first mode, a circuit configured to maintain the bias circuit in an operating state during a time the LNA is operating in a power down mode, and a switch circuit configured to switch the bias output from the LNA to the circuit when the LNA is powered down from the first mode to the power down mode.

Particular implementations can include one or more of the following features. The wireless transceiver can be compliant with one or more of the following IEEE standards—802.11, 802.11a, 802.11b, 802.11e, 802.11g, 802.11h, and 802.11i, and 802.14.

A dummy circuit is provided to which a bias circuit of an LNA can be coupled to during power down of the LNA. The dummy circuit maintains the bias circuit at an approximately normal operating state to advantageously reduce wake up time of a LNA that has been powered down. The effect of a large capacitance (in the bias circuit) on the wake up time is reduced.

The details of one or more implementations are set forth in the accompanying drawings and the description below. Other features and advantages will be apparent from the description and drawings, and from the claims.

DESCRIPTION OF DRAWINGS

Like reference symbols in the various drawings indicate like elements.

DETAILED DESCRIPTION

Figure 2:
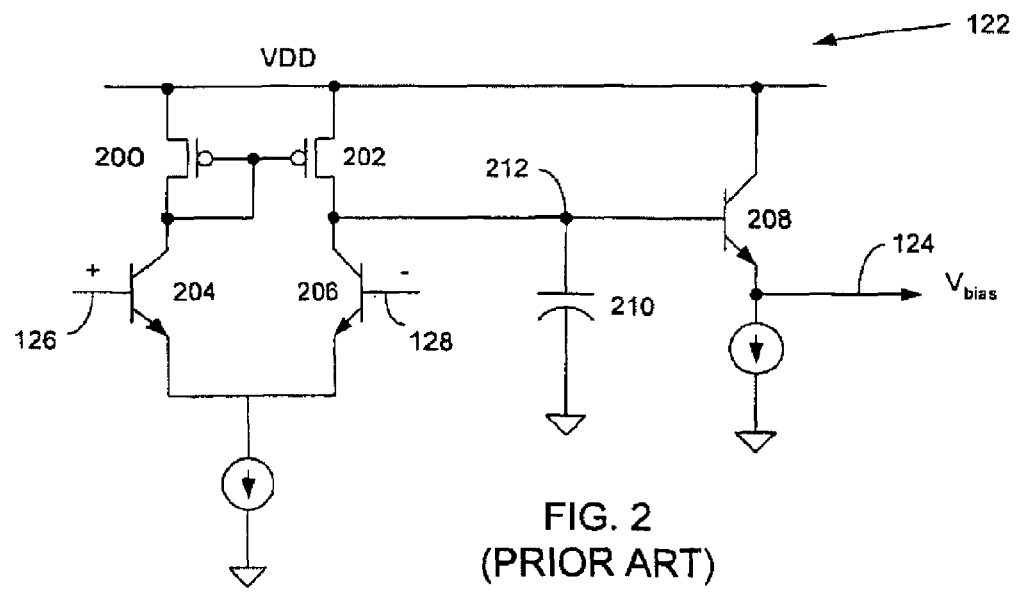
FIG. 2 is a schematic diagram illustrating a comparative amplifier of the bias circuit of FIG. 1.
Figure 3:
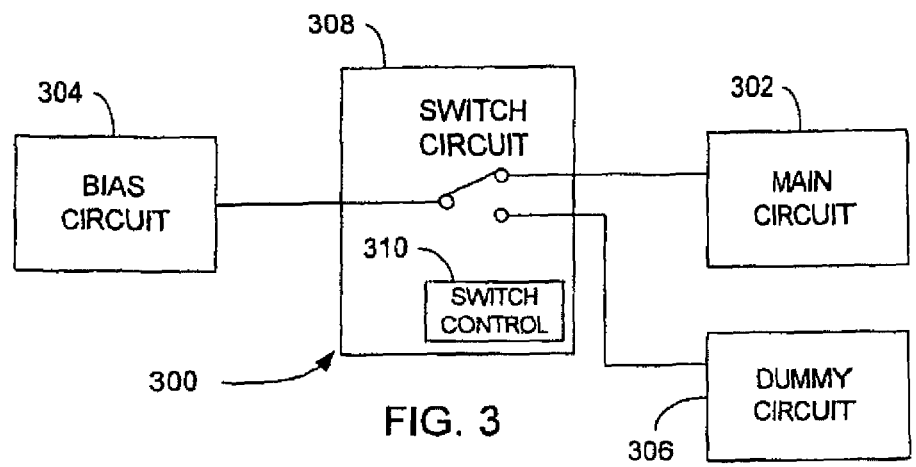
FIG. 3 illustrates a biasing system.
Figure 5:
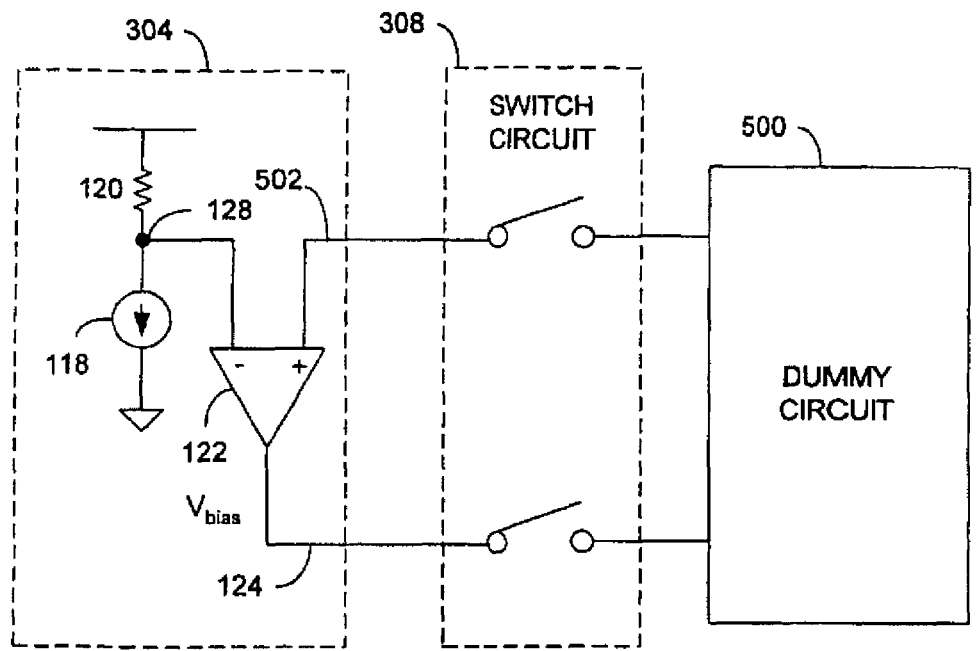
FIG. 5 illustrates a biasing scheme for a bias circuit of an LNA during a power down.

FIG. 3 shows a biasing system 300. Biasing system 300 includes a main circuit 302, a bias circuit 304, a dummy circuit 306, and a switch circuit 308, including a switch control 310. Main circuit 302 is a circuit in a device that operates in at least two modes: a normal mode (i.e., powered on), and a power down mode (e.g., a sleep mode). Bias circuit 304 includes a reference voltage source or a reference current source (e.g., reference current source 118 as shown in FIG. 5), and provides a bias current $I_{bias}$ and/or a bias voltage $V_{bias}$ (e.g., bias voltage 124 as shown in FIG. 5) to main circuit 302. Bias circuit 304 of FIG. 5 includes the comparative amplifier 122, as shown in FIG. 2, that further includes a capacitor (e.g., capacitor 210 of comparative amplifier 122 as shown in FIG. 2 and coupled to node 212) that must be quickly charged (or discharged) to a normal operating state (e.g., to a normal operating voltage). Dummy circuit 306 includes circuitry for maintaining bias circuit 304 at a normal operating state when main circuit 302 is powered down. Switch circuit 308 can be any of a number of conventional switching devices. Switching circuit 308 includes a switch control 310 to switch an output bias of the bias circuit between main circuit 302 and dummy circuit 306.

Figure 4:
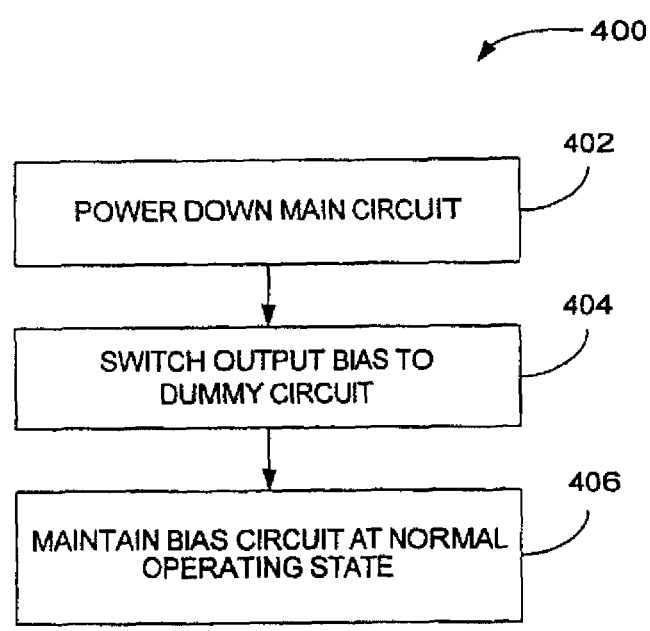
FIG. 4 shows a method for controlling a bias circuit during power down of a main circuit.

FIG. 4 shows a method 400 for controlling a bias circuit (e.g., bias circuit 304 of FIG. 3) during power down of a main circuit (e.g., main circuit 302 of FIG. 3). As shown, the main circuit is powered down (step 402). The main circuit can be powered down so that the main circuit consumes less power. Any conventional technique can be used to power down the main circuit (e.g., a shut off switch). An output bias ($I_{bias}$, $V_{bias}$) of the bias circuit is switched to a dummy circuit (e.g., dummy circuit 306 of FIG. 3) (step 404). Accordingly, at power down of the main circuit, the bias circuit is maintained in a normal operating state (step 406).

Figure 1:
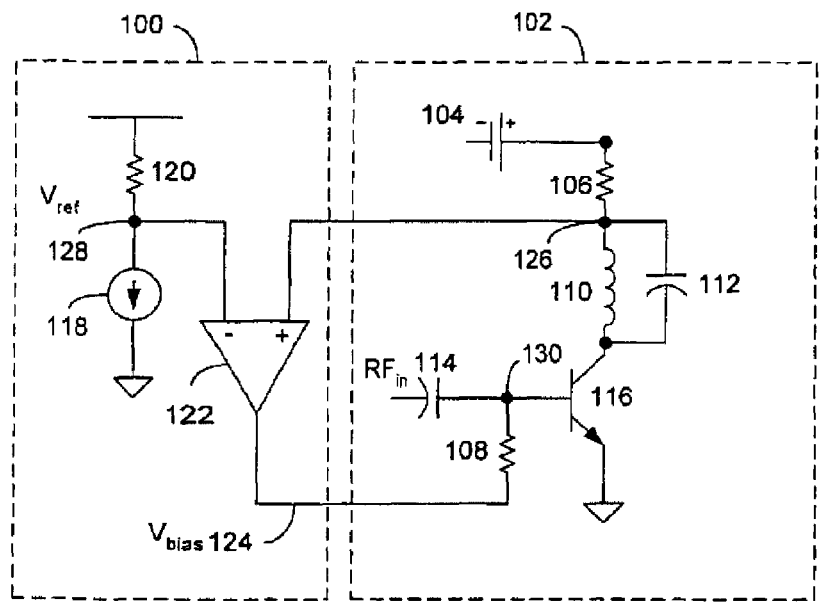
FIG. 1 is a schematic diagram illustrating a conventional bias circuit and LNA.

FIG. 5 illustrates a biasing system for a bias circuit (e.g., bias circuit 304) to reduce a wake up time of an LNA. The biasing system includes a dummy circuit 500 to which bias circuit 304 can be coupled (or switched by switch circuit 308) during power down of the LNA (e.g., LNA 102 of FIG. 1). Dummy circuit 500 can include any combination and types of CMOS transistors, bipolar transistors, resistors, capacitors, inductors, and the like, and operate to maintain bias circuit 304 at or near a normal operating state during power down of the LNA. For example, dummy circuit 500 can maintain a positive lead 502 of comparative amplifier 122 at a voltage level near a normal operating level. By maintaining positive lead 502 of comparative amplifier 122 at a voltage level near the normal operating level, the voltage at node 212 (FIG. 2) shifts only a small amount, if any, away from a normal operating voltage. In one implementation, dummy circuit 500 is in use (i.e., operational) only when the LNA is powered down.

Figure 6:
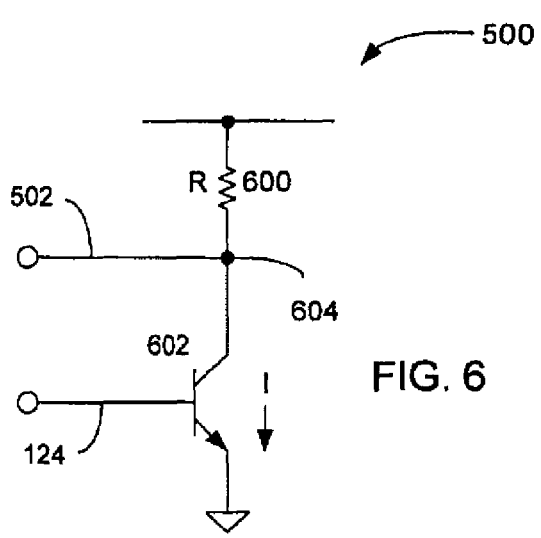
FIG. 6 illustrates a dummy circuit.

FIG. 6 illustrates an implementation of dummy circuit 500, formed by a resistor 600 and a bipolar transistor 602. To set a voltage at node 604 for positive lead 502, the magnitude of current flowing through resistor 600 can be controlled as well as controlling physical characteristics of resistor 600 or bipolar transistor 602 (e.g., size). Dummy circuit 500 can draw a small amount of current, and yet provide a large voltage at node 604 by including a relatively large resistance for resistor 600. Thus, dummy circuit 500 can have a low current draw and low power consumption (i.e., a lower current draw and a lower power consumption than LNA 102). Bias voltage 124 is provided as input to a base of bipolar transistor 602, and can be used as well to control the voltage of positive lead 502.

Figure 7:
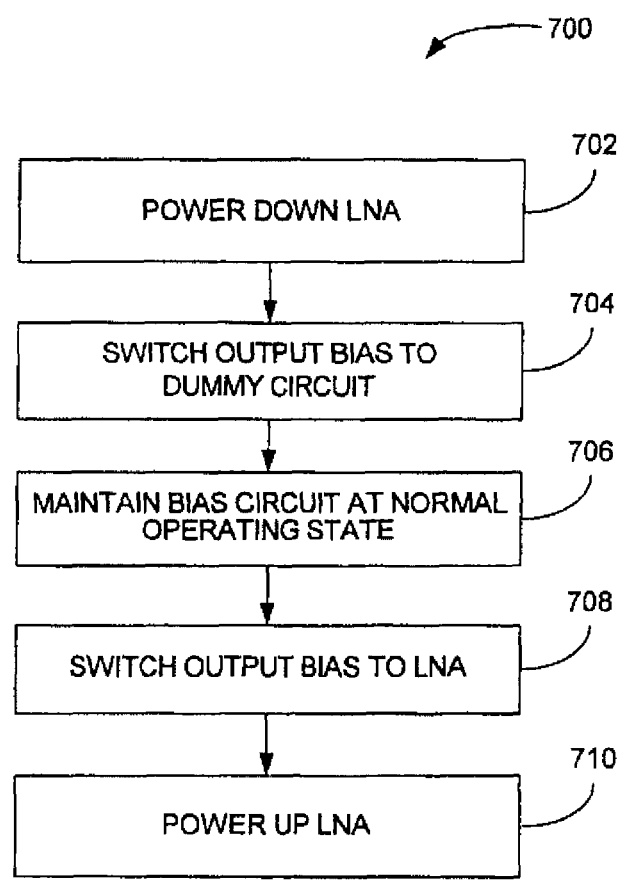
FIG. 7 is a flowchart of a process for LNA bias control during power down.

FIG. 7 shows a method 400 for controlling a bias circuit of a LNA. The LNA is powered down (step 702). The LNA can be powered down so that the LNA consumes less power. An output bias of the bias circuit that is used to bias the LNA is switched to a dummy circuit (step 704). The dummy circuit maintains the bias circuit at a normal operating state. At power up, the output bias of the bias circuit is switched to the LNA (step 708). The LNA is powered up (step 710). The bias circuit is, therefore, operating at approximately near a normal operating state when the LNA is powered up, resulting in a reduced wake up time for the LNA.

Figure 8:
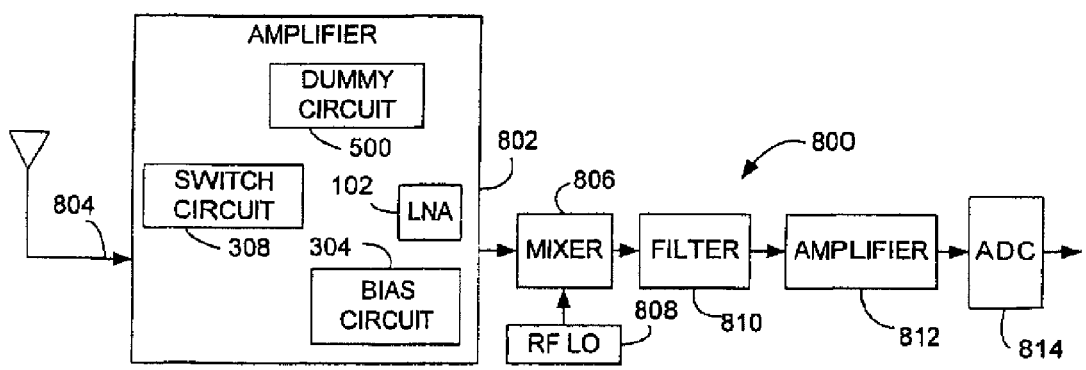
FIG. 8 is a block diagram of a wireless transceiver.

FIG. 8 shows a wireless transceiver 800 for communicating information. The receive path of wireless transceiver 800 includes an amplifier 802 for amplifying an input signal 804. Amplifier 802 includes bias circuit 304, LNA 102, dummy circuit 500, and switch circuit 308. A mixer 806 combines an amplified version of input signal 804 with a RF LO signal 808. A filter 810 and adjustable amplifier 812 filter and amplify the combined signal, and mix the generated signal with an Intermediate Frequency (IF) LO signal. An analog-to-digital converter (ADC) 814 converts the mixed signal to a digital signal for further processing. Wireless transceiver 800 can be IEEE 802 compliant with the following standards 802.11, 802.11a, 802.11b, 802.11e, 802.11g, 802.11h, 802.11i, and 802.14.

A number of implementations have been described. Nevertheless, it will be understood that various modifications may be made. For example, steps of the methods discussed above may be performed in any order. Accordingly, other implementations are within the scope of the following claims.

What is claimed is:

1. A method comprising:
   connecting an input of a bias circuit and an output of the bias circuit to another circuit while the other circuit is in a first power mode, such that the bias circuit has an operating state corresponding to the first power mode;
   switching the input of the bias circuit and the output of the bias circuit from the other circuit to a dummy circuit when a power mode of the other circuit is changed from the first power mode to a second power mode; and
   maintaining the bias circuit at the operating state corresponding to the first power mode using the dummy circuit while the other circuit is in the second power mode.

2. The method of claim 1, wherein the bias circuit includes a comparative amplifier, the input of the bias circuit is coupled to an input of the comparative amplifier, and maintaining the bias circuit at the operating state corresponding to the first power mode comprises maintaining the input of the comparative amplifier at a voltage level corresponding to the first power mode while the other circuit is in the second power mode.

3. The method of claim 1, wherein the bias circuit includes a capacitor coupled between the input of the bias circuit and the output of the bias circuit, and maintaining the bias circuit at the operating state corresponding to the first power mode comprises maintaining a voltage across the capacitor at a voltage level corresponding to the first power mode.

4. The method of claim 1, wherein the dummy circuit consumes less power than the other circuit when the other circuit is in the first power mode and operates only while the other circuit is in the second power mode.

5. The method of claim 1, wherein connecting the output of the bias circuit to the other circuit comprises providing one of a bias current or a bias voltage from the bias circuit to the other circuit.

6. The method of claim 1, comprising:
   switching the input of the bias circuit and the output of the bias circuit from the dummy circuit to the other circuit when the power mode of the other circuit is changed from the second power mode to the first power mode; and
   deactivating the dummy circuit while the other circuit is in the first power mode.

7. An apparatus comprising:
   switch circuitry that connects an input of a bias circuit and an output of the bias circuit to either another circuit or a dummy circuit; and
   control circuitry that operates the switch circuitry to:
   connect the input of the bias circuit and the output of the bias circuit to the other circuit while the other circuit is in a first power mode, such that the bias circuit has an operating state corresponding to the first power mode, and
   connect the input of the bias circuit and the output of the bias circuit from the other circuit to the dummy circuit when a power mode of the other circuit is changed from the first power mode to a second power mode, such that the bias circuit is maintained at the operating state corresponding to the first power mode while the other circuit is in the second power mode.

8. The apparatus of claim 7, wherein the bias circuit includes a comparative amplifier, the input of the bias circuit is coupled to an input of the comparative amplifier, and the control circuitry is configured to operate the switch circuitry to maintain the input of the comparative amplifier at a voltage level corresponding to the first power mode while the other circuit is in the second power mode.

9. The apparatus of claim 7, wherein the bias circuit includes a capacitor coupled between the input of the bias circuit and the output of the bias circuit, and the control circuitry is configured to operate the switch circuitry to maintain a voltage across the capacitor at a voltage level corresponding to the first power mode.

10. The apparatus of claim 7, wherein the dummy circuit consumes less power than the other circuit when the other circuit is in the first power mode and operates only while the other circuit is in the second power mode.

11. The apparatus of claim 7, wherein the control circuitry is configured to operate the switch circuitry to provide one of a bias current or a bias voltage from the bias circuit to the other circuit.

12. The apparatus of claim 7, wherein the control circuitry is configured to operate the switch circuitry to:
   switch the input of the bias circuit and the output of the bias circuit from the dummy circuit to the other circuit when the power mode of the other circuit is changed from the second power mode to the first power mode; and
   deactivate the dummy circuit while the other circuit is in the first power mode.

13. A system comprising:
   a bias circuit having an input and an output;
   a dummy circuit;
   another circuit; and
   a switching circuit configured to:
   connect the input of the bias circuit and the output of the bias circuit to the other circuit while the other circuit is in a first power mode, such that the bias circuit has an operating state corresponding to the first power mode;
   switch the input of the bias circuit and the output of the bias circuit from the other circuit to the dummy circuit when a power mode of the other circuit is changed from the first power mode to a second power mode; and
   maintain the bias circuit at the operating state corresponding to the first power mode using the dummy circuit while the other circuit is in the second power mode.

14. The system of claim 13, wherein the bias circuit includes a comparative amplifier, the input of the bias circuit is coupled to an input of the comparative amplifier, and the switching circuit configured to maintain the bias circuit at the operating state corresponding to the first power mode comprises the switching circuit configured to maintain the input of the comparative amplifier at a voltage level corresponding to the first power mode while the other circuit is in the second power mode.

15. The system of claim 13, wherein the bias circuit includes a capacitor coupled between the input of the bias circuit and the output of the bias circuit, and the switching circuit configured to maintain the bias circuit at the operating state corresponding to the first power mode comprises the switching circuit configured to maintain a voltage across the capacitor at a voltage level corresponding to the first power mode.

16. The system of claim 13, wherein the dummy circuit consumes less power than the other circuit when the other circuit is in the first power mode and operates only while the other circuit is in the second power mode.

17. The system of claim 13, wherein the switching circuit configured to connect the output of the bias circuit to the other circuit comprises the switching circuit configured to provide one of a bias current or a bias voltage from the bias circuit to the other circuit.

18. The system of claim 13, wherein the switching circuit is configured to:
   switch the input of the bias circuit and the output of the bias circuit from the dummy circuit to the other circuit when the power mode of the other circuit is changed from the second power mode to the first power mode; and
   deactivate the dummy circuit while the other circuit is in the first power mode.

* * * * *